(12) United States Patent
Feye-Hohmann (10) Patent No.: US 6,181,566 B1
(45) Date of Patent: Jan. 30, 2001

(54) ELECTRICAL OR ELECTRONIC DEVICE HAVING ELEMENT FOR FIXING AND MAKING ELECTRICAL CONTACT WITH A CIRCUIT BOARD CONDUCTOR

(75) Inventor: Jürgen Feye-Hohmann, Detmold (DE)

(73) Assignee: Phoenix Contact GmbH & Co., Blomberg (DE)

(*) Notice: Under 35 U.S.C. 154(b), the term of this patent shall be extended for 0 days.

(21) Appl. No.: 09/180,897

(22) PCT Filed: Mar. 10, 1998

(86) PCT No.: PCT/EP98/01368

§ 371 Date: Dec. 29, 1998

§ 102(e) Date: Dec. 29, 1998

(87) PCT Pub. No.: WO98/42168

PCT Pub. Date: Sep. 24, 1998

(30) Foreign Application Priority Data

Mar. 16, 1997 (DE) .............................. 197 10 767

(51) Int. Cl.⁷ .................. H05K 7/14; H01R 9/26
(52) U.S. Cl. ............. 361/759; 361/728; 361/740; 361/753; 361/797; 361/801; 439/76.1; 439/82
(58) Field of Search .................... 361/686, 724, 361/726, 727, 728–730, 732, 736, 752, 753, 759, 798, 801, 812, 823; 439/76.1, 82, 714–716

(56) References Cited

U.S. PATENT DOCUMENTS

| 4,472,764 | * | 9/1984 | Richard et al. | 361/775 |
| 4,672,511 | * | 6/1987 | Meusel et al. | 361/802 |
| 5,490,044 | * | 2/1996 | Kobayashi et al. | 361/823 |
| 5,653,018 | * | 8/1997 | Anderau et al. | 361/786 |
| 6,008,985 | * | 12/1999 | Lake et al. | 361/686 |

FOREIGN PATENT DOCUMENTS

| 44 10 171 | 4/1995 | (DE) . |
| 296 06 759 | 8/1996 | (DE) . |
| 0 364 618 | 4/1990 | (EP) . |
| 2 014 367 | 8/1979 | (GB) . |
| 502 750 | 3/1971 | (SE) . |

* cited by examiner

Primary Examiner—Jayprakash N. Gandhi
(74) Attorney, Agent, or Firm—Nixon Peabody LLP; David S. Safran (57) ABSTRACT

The invention relates to an electrical or electronic device (1) for placement on a support rail (2), with a housing (3), and with a circuit board (4) located in the housing (3). To ensure reliable placement of the circuit board (4) in the housing (3) it is provided as claimed in the invention that there is at least one fixing means (27) which is inserted from the outside of the housing (3) into the corresponding openings (26) in the circuit board (4) and in the housing (3).

9 Claims, 9 Drawing Sheets

ELECTRICAL OR ELECTRONIC DEVICE HAVING ELEMENT FOR FIXING AND MAKING ELECTRICAL CONTACT WITH A CIRCUIT BOARD CONDUCTOR

BACKGROUND OF THE INVENTION

1. Field of the Invention

The invention relates to an electrical or electronic device for placement on a support rail, with a housing and with a circuit board located in the housing.

2. Description of Related Art

An electrical or electronic device of the initially mentioned type has long been known in practice. To install the circuit board it is generally pushed via a corresponding guide in the housing into the latter. As it is being pushed in, the circuit board generally makes contact with the corresponding contacts which are provided in the housing for connection of the circuit board. After inserting the circuit board the housing is generally sealed. If the circuit board is not properly inserted in the housing, it can happen that there is no contact or there is poor contact with the corresponding contacts in the housing. The circuit board can also shift when using or handling the electrical or electronic device.

SUMMARY OF THE INVENTION

The object of the invention is to make available an electrical or electronic device of the initially mentioned type in which sufficient contact of the circuit board in the installed state is ensured in any case.

This object is achieved as claimed in the invention essentially in that there is at least one fixing means which is inserted from the outside of the housing into the corresponding openings in the circuit board and in the housing. The use of the fixing means as claimed in the invention offers not only the advantage that shifting of the circuit board within the housing is prevented in any case when the electrical or electronic device is being handled or used. Use of the fixing means also ensures that in any case proper contact between the circuit board and the contacts located in the housing is ensured. Ultimately this is done by the fact that insertion of the fixing means into the openings in the housing and the circuit board is possible only when these openings are aligned. This means that the circuit board in this position is located in the desired installation and contact-making position.

The invention is especially suitable in electrical or electronic devices with a housing made in at least two parts and on the one hand having a top part which holds the circuit board and on the other at least one base part which has a circuit board receiver for making contact in the circuit board. Because the housing can be divided, there is the possibility of removing the circuit board together with the top part of the housing without interrupting the bus connection which is formed via the base part. Since in this embodiment the circuit board in the installed state is held in the circuit board receiver, therefore it can be ensured by at least one fixing means that the circuit board is removed from the circuit board receiver when the top part is removed and does not remain on the base part.

As has already been indicated, the invention is especially well suited in electrical or electronic devices which are designed for a data and/or power bus connection for making contact with adjacent electrical or electronic devices placed on the support rail. In this case on the base part there are contacts which point in the lengthwise direction of the support rail for the data and/or power bus connection for making contact with adjacent electrical or electronic devices which have the corresponding contacts and which are placed on the support rail.

In order on the one hand to facilitate insertion of the circuit board into the housing and on the other insertion of the fixing means into the openings, there is a guide for the circuit board in the housing.

The circuit board can be fixed in the housing especially easily by the fixing means being inserted simply into the circuit board without being further connected to the latter. In particular soldering to the circuit board is unnecessary. In order to achieve a reliable connection between the circuit board and the fixing means, the fixing means has at least one, but preferably two insertion legs which extend in the lengthwise direction of the support rail, on the insertion leg there being at least one thickened area via which good frictional engagement with the corresponding opening in the circuit board can be achieved.

In addition to the fixing function, the fixing means can however also perform another function, i.e. it can be used for electrical connection. Often feed contacts must be attached to the circuit board. This can easily be done with a corresponding design via the fixing means. For this reason the fixing means should have at least one terminal element in the form of a lug. In this case the insertion leg makes contact with a printed conductor on the circuit board. The electrical or electronic device then also has the function of an add-on terminal.

So that the fixing means does not laterally project over the electrical or electronic device it is provided in one advantageous embodiment that the fixing means is held in a corresponding receiver in the top part. If in this embodiment the fixing means has at least one terminal element, therefore for connection of feed contacts, in the top part there is at least one connection opening for insertion of the feed contact into the terminal element and at least one actuation opening for actuating the terminal element.

So that when the terminal element is being used the fixing means is not subjected to mechanical stresses which could be transferred to the circuit board, the fixing means has a leg which projects out of the terminal element and from which the insertion leg projects. On the leg there is at this point a step, while in the receiver there is a corresponding step-shaped slot in which the step of the leg is located and adjoins the housing. Any tensile or compressive load on the terminal element is thus accommodated by the housing and is not transferred to the circuit board.

So that the fixing means cannot fall out of the electrical or electronic device, finally there is a cover for the receiver which can be detachably joined to the housing, preferably which can catch.

Other features, advantages and possible applications of this invention follow from the following description of embodiments using the drawings and the drawings themselves.

The figures show an electrical or electronic device 1 which is intended to be placed on a support rail 2 made as a top hat rail. The electrical or electronic device 1 itself has a housing 3 which consists of an insulating material, especially plastic. In the housing 3 there is a circuit board 4. The circuit board 4 is conventionally provided with printed conductors 5 optionally on both sides of the circuit board and with electronic components which are not detailed. Furthermore, the electrical or electronic device 1 has contacts 6a on one side 11a which are made as blade contacts and which point in the lengthwise direction R of the support rail, and corresponding contacts 6b made as contact receivers on the other side 11b for a data and/or power bus connection for making contact with other adjacent electronic devices which have the corresponding contacts and which are placed on the support rail 2.

Electrical or electronic devices 1 of the aforementioned type can be arranged in a row next to one another on a support rail 2 based on their design, a data and/or power bus connection arising via the respective contacts 6a, 6b. The electrical or electronic device 1 shown is moreover made in the manner of an add-on terminal and is suited especially for protected use in hazardous locations.

In the embodiment of FIGS. 1 to 5 the housing 3 is made in at least two parts. Here the housing 3 has a top part 7 which holds the circuit board 4 and a base part 8 which has contacts 6a, 6b. To make contact with the base part 8 the latter has a circuit board receiver 9 which projects above the top 10 of the base part 8. The contacts in the circuit board receiver 9 correspond to the contacts 6a, 6b in sides 11a, 11b of the base part 8.

For detachable connection of the top part 7 to the base part 8, there is a first locking device which is made as a catch connection. For this reason the first locking device has a spring-loaded catch arm 12 which is located on the top part 7. The catch arm 12, which projects downward over top part 7, has a catch segment 13 which interacts with the two corresponding catch hooks 14, 15 which are provided on the face 16 of the base part 8. The catch hooks 14, 15 and the catch segment 13 each have contact bevels to facilitate catching. The two catch hooks 14, 15 are spaced apart so that the catch and in the locked state is between the catch hooks 14, 15. To open the catch connection of the first locking device, on the end of the catch arm 12 there is an engagement section in the form of a pocket 17 into which a tool, for example a screwdriver, is inserted and using which the catch arm 12 can be released. While there is a catch connection on one face on the housing 3, on the other face on the top part 7 there is a receiving slot which is not shown for a corresponding projection 18 on the base part 8 so that the top part 7 can be swivelled onto the base part 8.

For detachable connection of the base part 8 to the support rail 2 there is a second locking device. Like the top part 7 onto the base part 8, the base part 8 can also be swivelled onto the support rail 2. For this reason on the bottom 20 of the base part 8 there is a slot, which is not detailed, for engaging the corresponding projection 2a of the support rail 2. Opposite the swivel connection, on the base part 8 there is a spring-loaded latch 19 which is used for unilaterally reaching under the support rail 2 or the corresponding projection 2b of the support rail 2.

The latch 19 is located on the bottom 20 of the base part 8. The latch 19 is roughly U-shaped and extends over the entire bottom 20 of the base part 8. The top ends of the U-legs are bent onto one another and each fits into a corresponding slot 21 on the sides 11a, 11b on the base part 8. In this way the latch 21 is captively held on the base part 8. On the latch 19 there is an actuating opening 22, while in the base part 8 there is a through insertion opening 23 which is accessible from the top 10 for a tool 24 such as a screwdriver (compare especially FIGS. 3 and 4). The insertion opening 23 is only accessible when the top part 7 has been removed from the base part 8. In the locked state in which the latch 19 with its locking section 25 fits under the projection 2b of the support rail 2, the actuating opening 22 and the insertion opening 23 are arranged offset to one another, insertion of the tool 24 into the actuating opening 22 however still being possible. By continued insertion of the tool 24 the actuation opening 22 opens into the insertion opening 23, the latch 19 being moved against the spring load until the locking section 25 no longer fits under the corresponding projection 2b of the support rail 2 and the base part 8 can thus be swiveled away from the support rail 2.

The circuit board 4 itself is held in the housing 3 or in the upper part 7 of the housing 3 in a guide which also facilitates the insertion of the circuit board 4 during installation. As follows especially from FIGS. 5 to 9, in the circuit board 4 and in the top part 7 there are corresponding openings which are used for insertion of at least one fixing means 27 from the outside of the housing 3.

Figure 6:
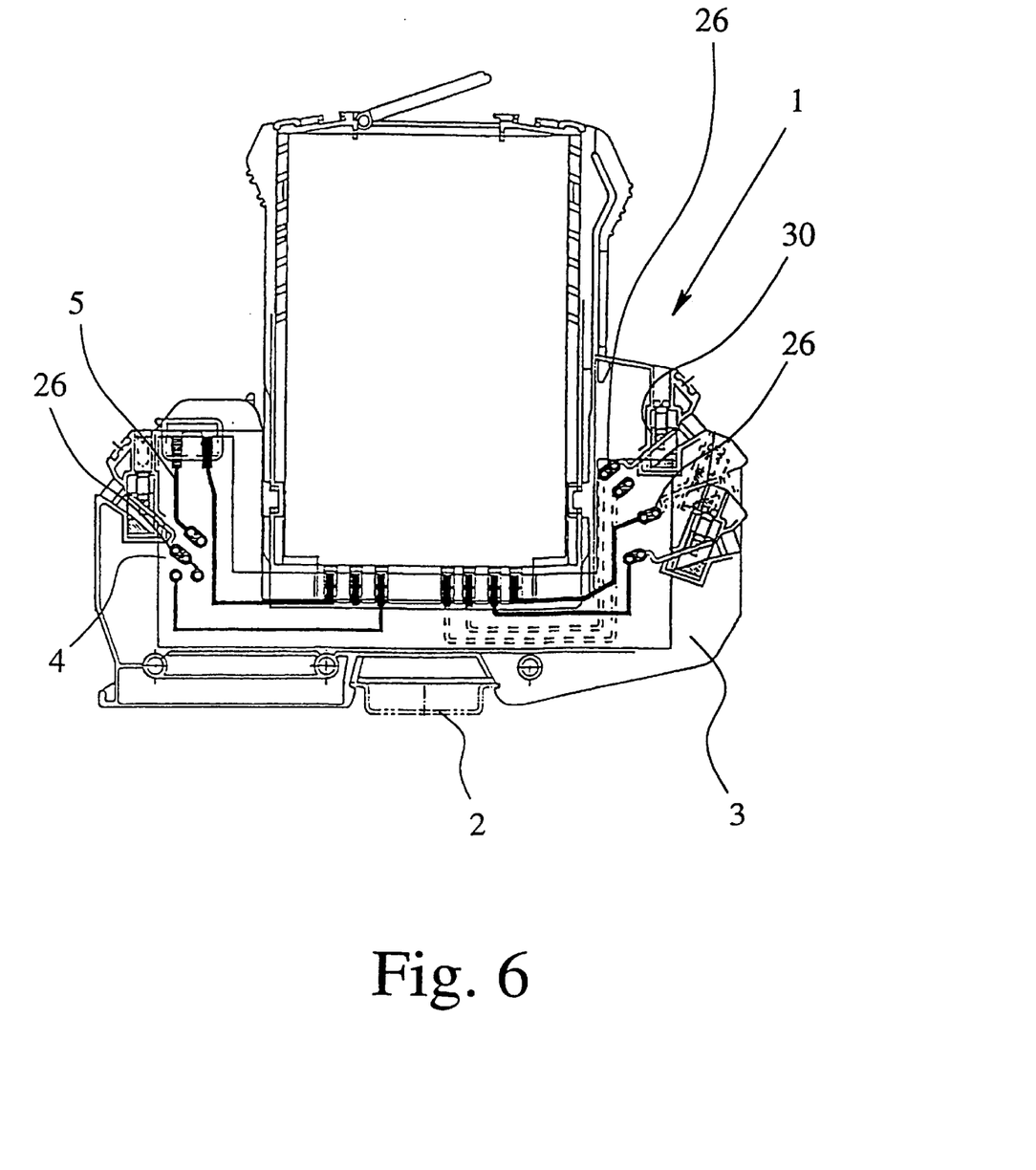
FIG. 6 shows a front view in a section of another embodiment of an electrical or electronic device as claimed in the invention.
Figure 7:
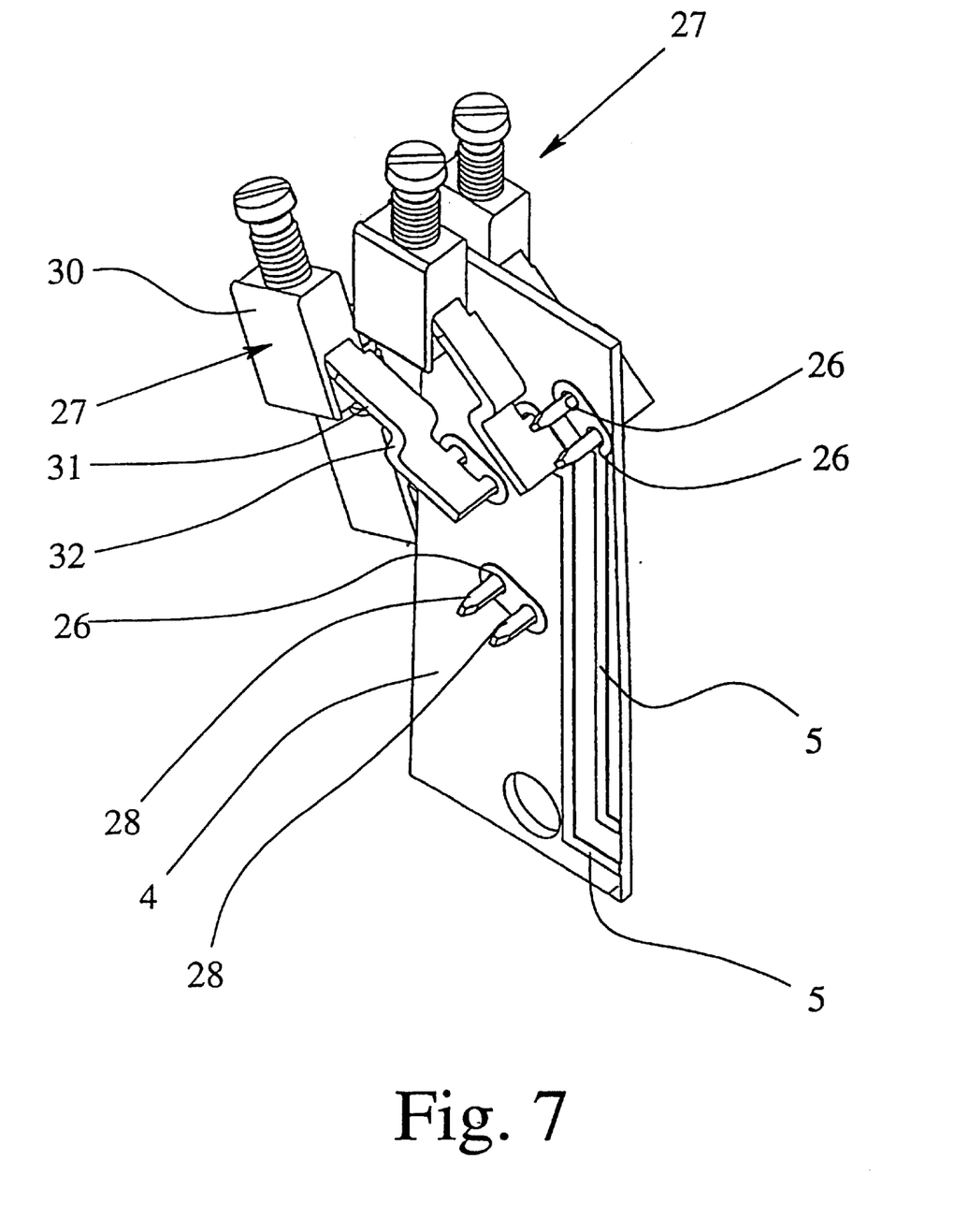
FIG. 7 shows a perspective view of the type of fixing of the circuit board of an electrical or electronic-device as claimed in the invention, omitting the housing.
Figure 8:
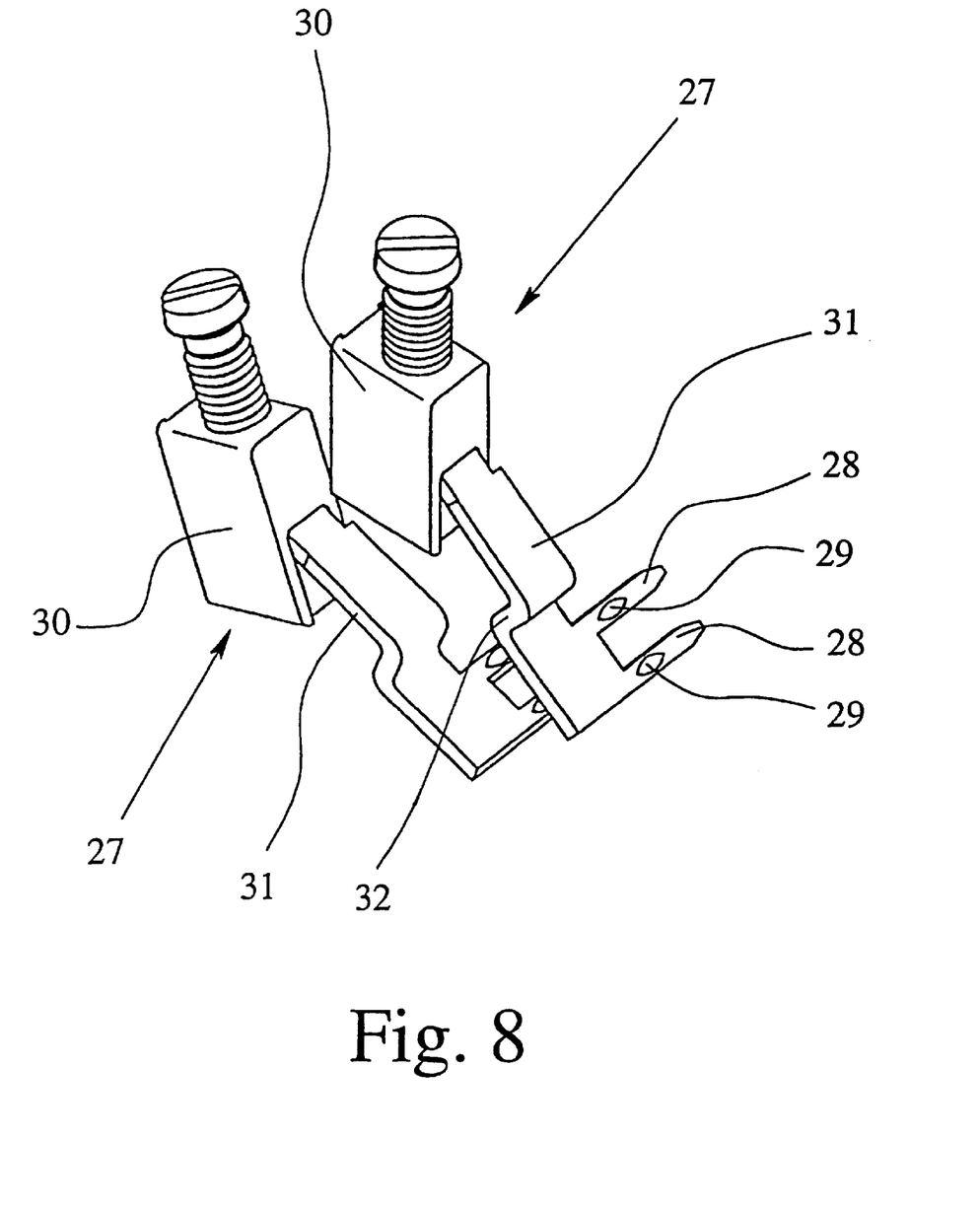
FIG. 8 shows a perspective view of two fixing means for fixing the circuit board.
Figure 9:
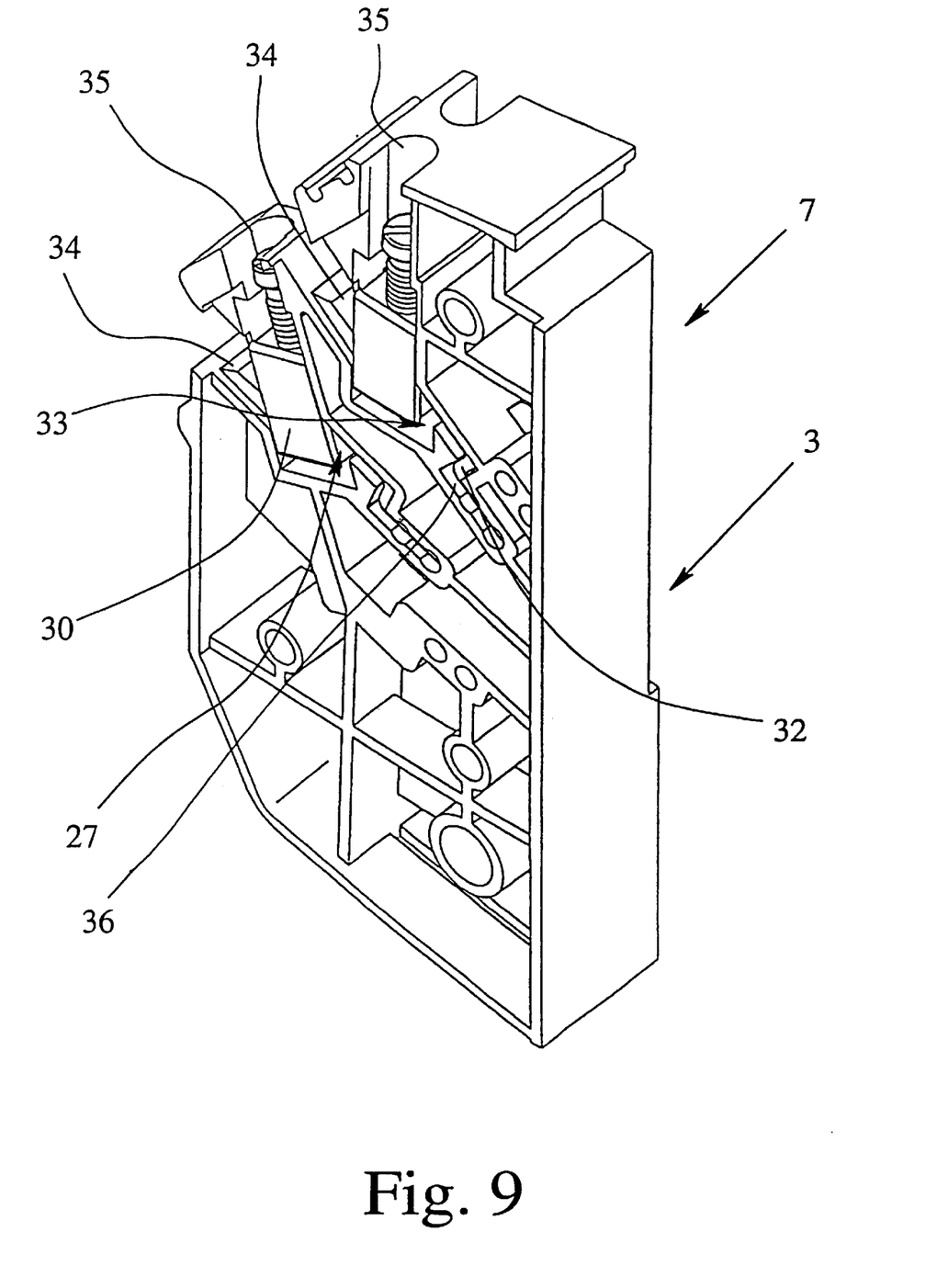
FIG. 9 shows a perspective view of part of the housing of an electrical or electronic device as claimed in the invention.

Although the use of fixing means 27 is of course especially advantageous in conjunction with the aforementioned two-part housings 3, there can also be fixing means 27 for fixing of the circuit board 4 in a one-part housing 3, as is shown in FIG. 6. The connection of the individual fixing means 27 to the circuit board 4 takes place in any case solely via insertion without the need for other connecting, especially soldering.

Figure 1:
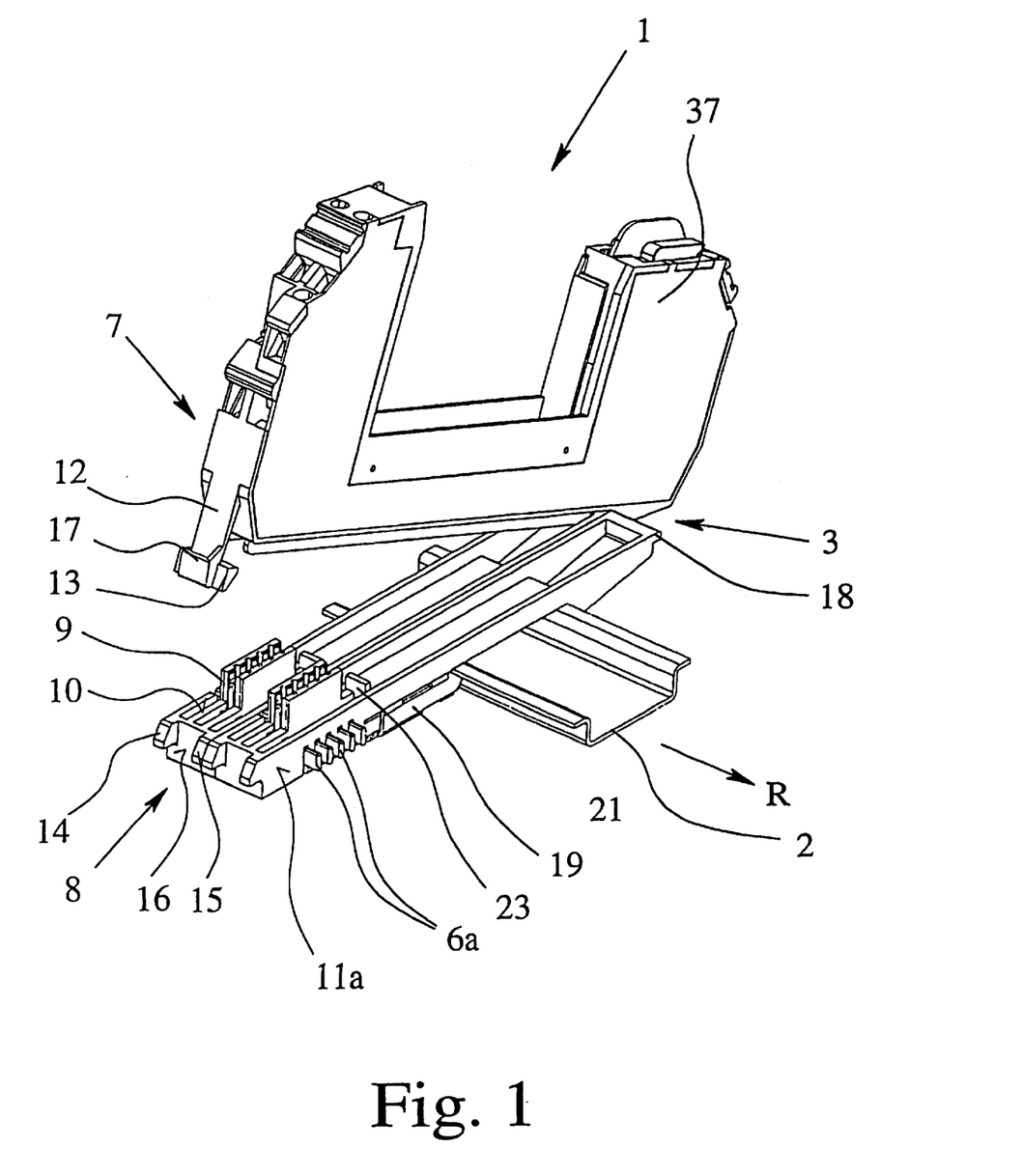
FIG. 1 shows a perspective view of an electrical or electronic device as claimed in the invention placed on the support rail.
Figure 2:
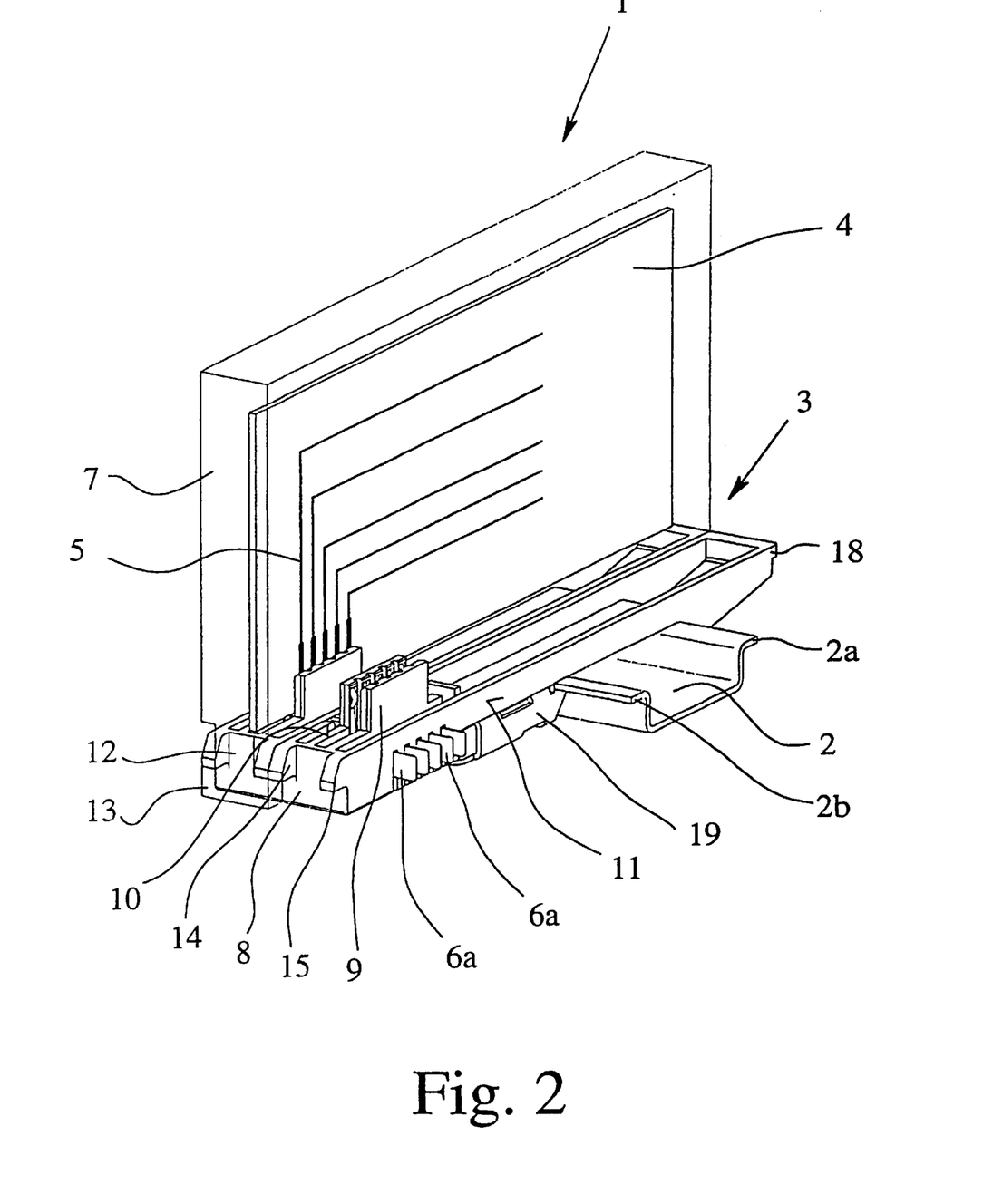
FIG. 2 shows a perspective view of another embodiment of an electrical or electronic device as claimed in the invention.
Figure 3:
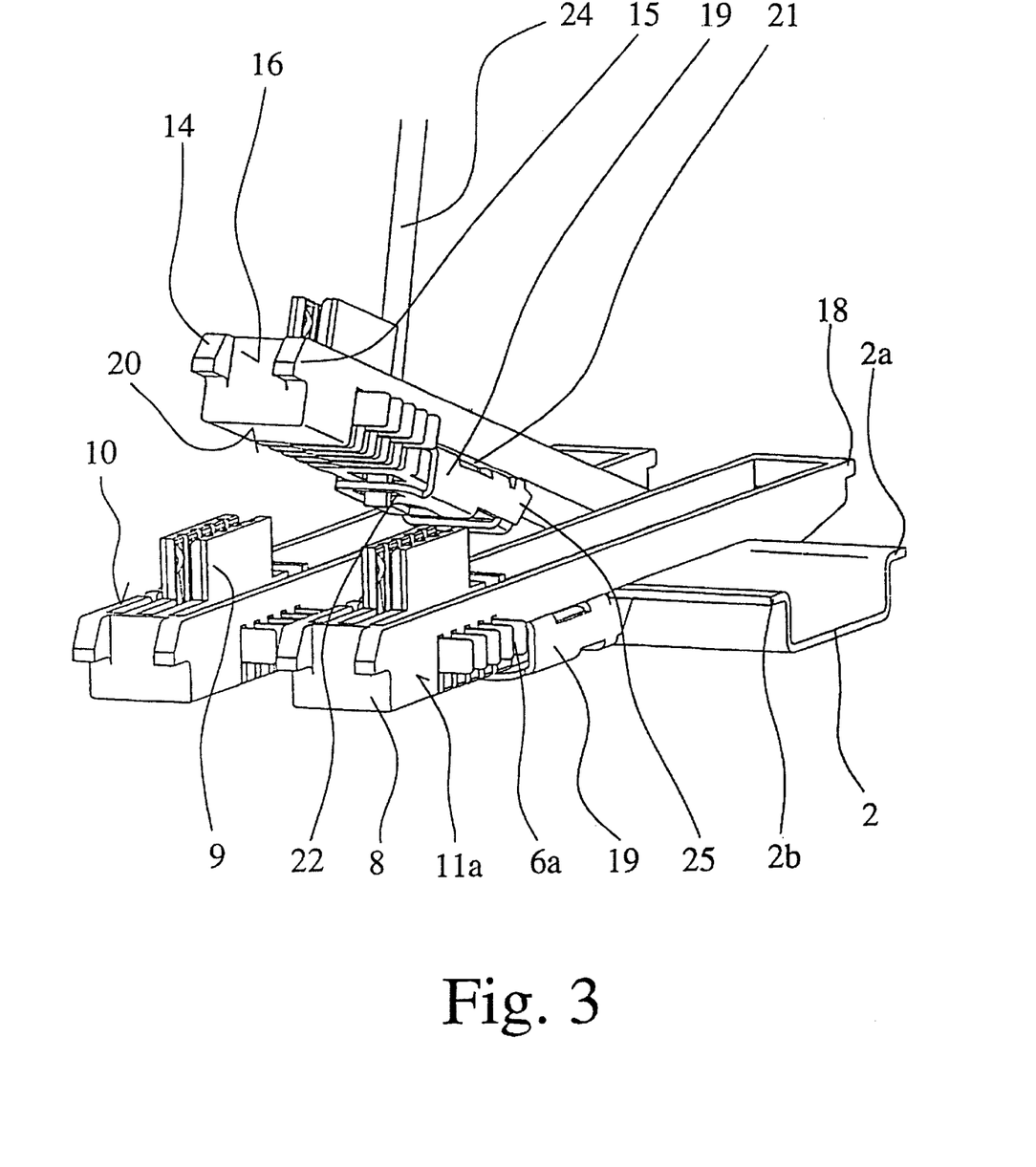
FIG. 3 shows a perspective view of base parts of an electrical or electronic devices as claimed in the invention.
Figure 4:
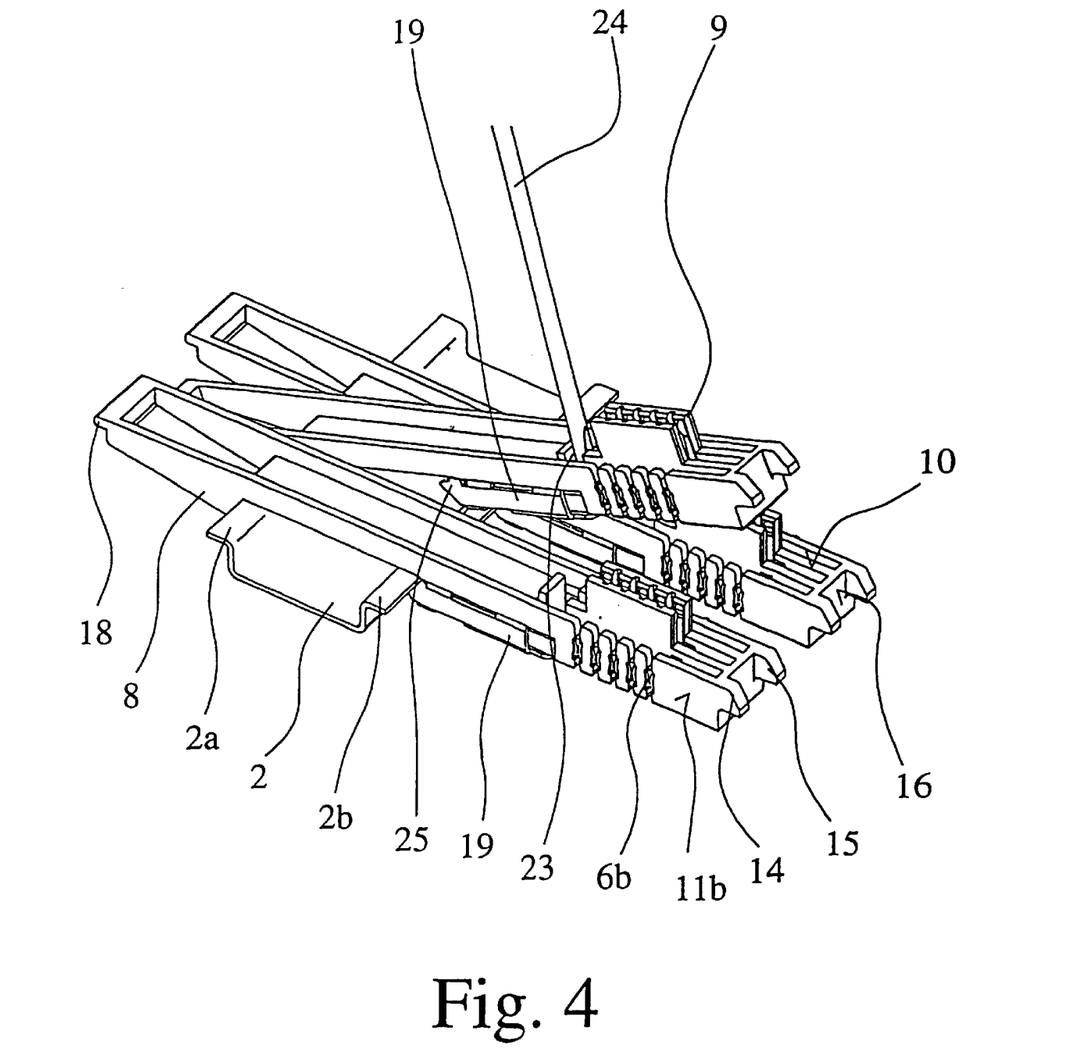
FIG. 4 shows another perspective view of base parts of an electrical or electronic devices as claimed in the invention.
Figure 5:
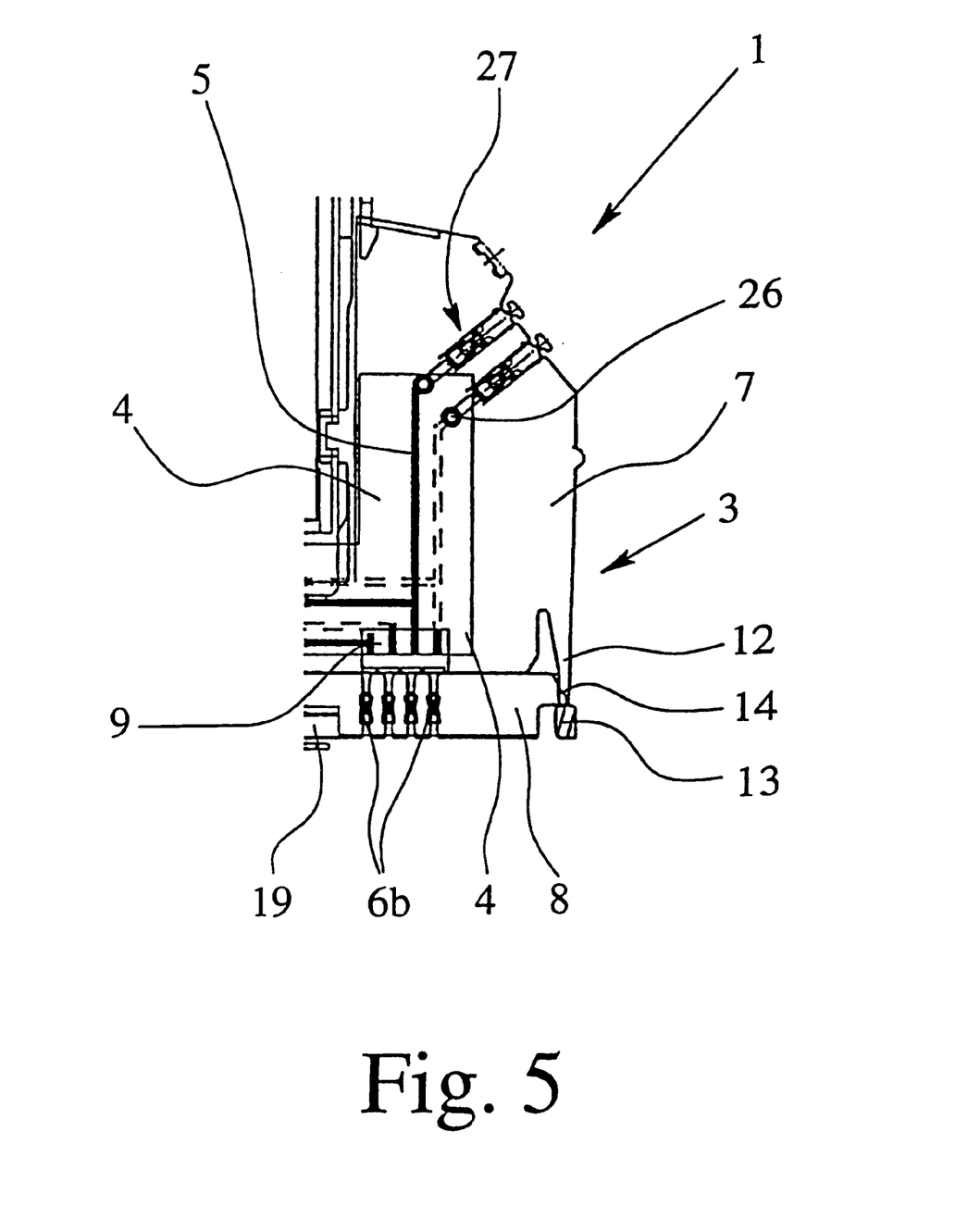
FIG. 5 shows a front view in a section of one part of an electrical or electronic device as claimed in the invention.

For insertion purposes the fixing means 27 in the embodiment shown in FIG. 5 has an insertion leg 28, while in the embodiments shown in FIGS. 6 to 9 there are two insertion legs 28 each per fixing means 27. The insertion legs 28 run at roughly a right angle to the plane of the circuit board 4 and thus coaxially to the direction R of the support rail. Since the individual insertion legs 28 are inserted simply into the circuit board 4, to improve the plug connection there is at least one thickened area 29 on the insertion leg 28.

In addition to their fixation function, individual fixing means 27 are also used for connection of feed contacts. For this purpose, on the end of the fixing means 27 opposite the insertion leg 28 there is a terminal element 30. The terminal element 30 shown in FIGS. 6 to 9 is a screw terminal here. The openings 27 are each located in the area of the printed conductors 5 so that when an insertion leg 28 is inserted contact is made with the pertinent printed conductor.

The contact leg present in the terminal element 30 is routed out of the terminal element 30 as a leg 31. The insertion legs 28 are bent from leg 31 roughly at a right angle. Before bending of the insertion leg 28 a step 32 is made on the leg 31.

The fixing means 27 are accommodated in the corresponding receivers 33 in the housing 3 or in the top part 7 of the housing 3. For connection of the feed contacts for each fixing means 27 there is a connection opening and for actuating the terminal element 30 there is one actuation opening 35 each. Corresponding to the step 32 on the leg 31 there is otherwise in the receiver 33 a corresponding step-shaped slot 36 in which the step 32 adjoins the housing 3 so that any compressive and tensile loads are transferred to the housing 3.

In order to be able to close the receiver 33, the housing 3 or the top part 7 has a cover 37 which can be detachably connected to the housing 3 or the top part 7, in particular can be locked to it.

What is claimed is:

1. Electrical or electronic device for placement on a support rail comprising a housing, a circuit board located in the housing and at least one fixing means which is inserted from the outside of the housing into corresponding openings in the circuit board and in the housing; wherein the fixing means is inserted simply into the circuit board for connection to it without being further connected to the circuit board; wherein the fixing means has at least one insertion leg aligned perpendicular to the lengthwise of the circuit board; wherein the fixing means is made for electrical connection, and wherein the insertion leg makes contact with at least one printed conductor of the circuit board.

2. Electrical or electronic device as claimed in claim 1, wherein the housing (3) is made in at least two parts and there is a top part (7) which holds the circuit board (4) and there is at least one base part (8) which has a circuit board receiver (9) for making contact with the circuit board (4).

3. Electrical or electronic device as claimed in claim 2, wherein on the base part there are contacts which extend perpendicular to the lengthwise direction of the circuit board for a data and/or power bus connection for making contact with adjacent electrical or electronic devices which have corresponding contacts when placed, in use, on a support rail.

4. Electrical or electronic device as claimed in claim 1, wherein there is a guide for the circuit board (4) in the housing (3).

5. Electrical or electronic device as claimed in claim 1, wherein the fixing means has two insertion elements, each of which has at least one thickened area.

6. Electrical or electronic device as claimed in claim 1, wherein the fixing means has at least one terminal element.

7. Electrical or electronic device for placement on a support rail comprising a housing, a circuit board located in the housing and at least one fixing means which is inserted from the outside of the housing into corresponding openings in the circuit board and in the housing; wherein the fixing means is held in a corresponding receiver in the housing and wherein the housing has at least one connection opening and at least one actuation opening for a terminal element of the at least one fixing means.

8. Electrical or electronic device as claimed in claim 7, wherein the fixing means has at least one terminal element and a leg which projects out of the terminal element and from which the at least one insertion leg projects, and wherein, on the leg, there is a step and the housing has at least one receiver with a corresponding step-shaped slot in which the step is located.

9. Electrical or electronic device as claimed in claim 7, wherein there is a cover for the at least one receiver and wherein the cover can be detachably connected to the housing.

* * * * *